United States Patent [19]

Daniels et al.

[11] Patent Number: 5,397,685

[45] Date of Patent: * Mar. 14, 1995

[54] LIGHT-SENSITIVE COMPOSITION AND PROCESS

[75] Inventors: George R. E. Daniels, Mattapan, Mass.; Michael J. Oddi, Springhill, Fla.; Kevin J. Cheetham, Millbury; Stephen S. Rodriguez, Monument Beach, both of Mass.

[73] Assignee: Shipley Company Inc., Marlborough, Mass.

[*] Notice: The portion of the term of this patent subsequent to Apr. 27, 2010 has been disclaimed.

[21] Appl. No.: 157,312

[22] Filed: Nov. 26, 1993

Related U.S. Application Data

[62] Division of Ser. No. 829,371, Feb. 3, 1992, Pat. No. 5,312,715.

[51] Int. Cl.$^6$ ................................ G03C 5/00
[52] U.S. Cl. .................... 430/325; 430/280; 430/311; 430/315; 430/324; 430/330; 430/327; 430/935
[58] Field of Search ............... 430/325, 280, 311, 315, 430/324, 330, 327, 935

[56] References Cited

U.S. PATENT DOCUMENTS

| | | | |
|---|---|---|---|
| 4,581,321 | 4/1986 | Stahlhofen | 430/325 |
| 5,206,116 | 4/1993 | Daniels et al. | 430/311 |

FOREIGN PATENT DOCUMENTS

| | | |
|---|---|---|
| 0255989 | 2/1988 | European Pat. Off. |
| 55-129341 | 10/1980 | Japan |

OTHER PUBLICATIONS

Crivello, James V., "Possibilities For Photoimaging Using Onium Salts", Presented at a Regional Technical Conference of the Society of Plastic Engineers, Inc. on Nov. 8, 9, and 10, 1982.

*Primary Examiner*—Marion E. McCamish
*Assistant Examiner*—Mark A. Chapman
*Attorney, Agent, or Firm*—Robert L. Goldberg

[57] ABSTRACT

A photoimageable composition and process for use of the same. The composition comprises a binder that is a mixture of a phenolic resin and a multifunctional epoxy or vinyl compound and a curing system comprising a photoactive compound capable of generating a curing catalyst capable of crosslinking the binder components. The process for use of the composition comprises application of the composition to a substrate, drying of the same, exposing the dried coating to activating radiation, curing the binder in light exposed areas, developing the coating and thermally curing the developed image. The composition is especially useful as a solder mask.

10 Claims, 1 Drawing Sheet

SEQUENCE 2

SEQUENCE 1

LIGHT-SENSITIVE COMPOSITION AND PROCESS

This is a divisional of application Ser. No. 07/829,371, U.S. Pat. No. 5,312,715, on Feb. 3, 1992.

BACKGROUND OF THE INVENTION

1. Introduction

This invention relates to light-sensitive compositions. More particularly, this invention relates to aqueous developable light-sensitive compositions useful as high resolution soldermasks in the manufacture of printed circuit boards.

2. Description of the Prior Art

Aqueous developable liquid soldermasks are known. They are typically applied as a wet coating, such as by curtain coating, dried, image-wise exposed to activating radiation, partially cured using heat, developed, such as with an aqueous alkaline solution, and often finally cured. Examples of aqueous developable soldermasks are disclosed in European patent Publication No. 0,255,989 and in Japanese published Patent Disclosures 55-129341 and 60-26943 published Oct. 7, 1980 and Feb. 9, 1985, respectively. Soldermasks disclosed in these publications typically consist of at least one alkali soluble phenolic resin, a compound containing at least two epoxy or vinyl ether groups, generally an epoxy resin, and a photoactive component such as a sulfonium salt or an azide compound capable of initiating crosslinking of the epoxy or vinyl ether compound upon exposure to activating radiation with heating as necessary. The phenolic component, in adequate concentration, enables aqueous development, and the combination of the epoxy or vinyl ether compound and the photoactive component permits cure in exposed areas of the film.

In use, image-wise exposure of a dry film of the above composition to activating radiation initiates a photoreaction, such as the liberation of an acid. The acid catalyzes crosslinking of the epoxy or vinyl ether component of the formulation in imaged areas where the photoreaction occurs. Selective curing results in areas of differential solubility that permit development of the soldermask film.

It has been found that the aqueous developable soldermasks, as disclosed in the referenced publications, fail to yield a high resolution image upon development. It is believed that a cause of poor resolution is the phenolic component of the formulation. Prior to development, the phenolic component is essentially uncured because the liberation of acid by the photoreaction does not catalyze curing of the phenolic component of the soldermask. Consequently, upon contact of an exposed film with developer, selective development is possible between exposed and non-exposed areas because the epoxy or vinyl ether component is cured, but high resolution images are not obtained because the phenolic component is non-selectively dissolved from both exposed and non-exposed portions of the coating alike.

In EPO application publication No. 0,255,989 referenced above, it is disclosed that a thermal curing agent for the phenolic component may be included in the formulation. However, if included, the phenolic of the composition cannot be cured prior to development because curing will take place uniformly in both exposed and non-exposed portions of the film making development difficult or impossible. Therefore, inclusion of a thermal curing agent would not overcome the problem of poor resolution following development.

SUMMARY OF THE INVENTION

The photoimageable composition of the invention comprises a binder that is a mixture comprising an alkali soluble phenolic resin and a compound containing at least two active groups selected from epoxy groups, vinyl ether groups and mixtures of the two, a photoactive compound that liberates a curing catalyst for binder components in imaged areas upon patterned exposure to activating radiation, and a crosslinking agent for the phenolic resin component of the binder that is activated in the presence of a photogenerated curing catalyst. In a preferred embodiment of the invention, the primary components of the binder comprise a poly(vinyl phenol) and an epoxy resin.

The composition of the invention is used in conventional manner. It is applied to a substrate, dried, exposed to patterned radiation at a wavelength that causes a photoreaction that liberates a curing catalyst, heated as necessary to cure the film in exposed areas, developed and optionally heat cured. In accordance with the invention, all primary components of the binder, inclusive of the phenolic component, are cured in imaged areas, but not elsewhere. Therefore, upon development, high resolution images are obtained because uncured binder is essentially not solvated in the exposed areas of the film. Following development, a post development bake step may be employed to complete the curing reactions.

DESCRIPTION OF THE PREFERRED EMBODIMENTS

Figure 1:
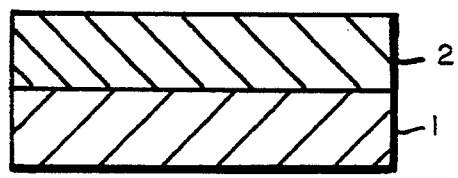
FIGS. 1, 2, 3a, 3b, 4a, 4b, and 5a are drawing is a diagrammatic representation of comparative processes and results using a photoactivated curing agent for all polymer components in accordance with the invention compared to results that would be obtained using a non-photoactive curing agent for the binder components.
Figure 2:
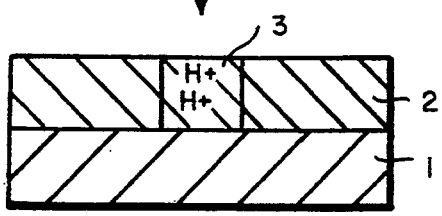
Figure 3A:
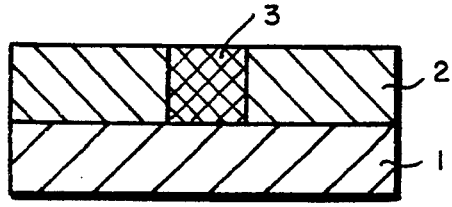
Figure 3B:
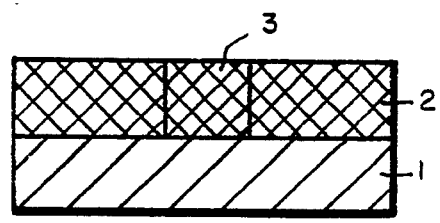
Figure 4B:
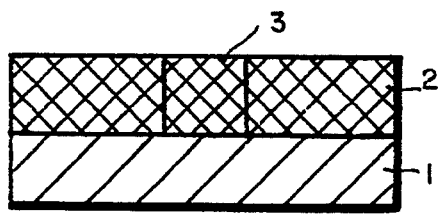
Figure 4A:
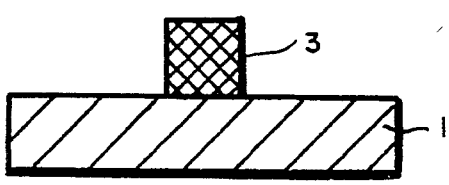
Figure 5A:
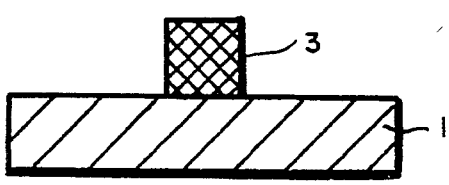

The phenolic resin component of the composition of the invention is a film-forming resin having phenolic hydroxyl groups that permit development of the composition in an aqueous alkaline developer. Phenolic resins are well known in the art. Exemplary phenolic resins include, for example, phenol aldehyde condensates known as the novolak resins, homo and copolymers of alkenyl phenols and homo and copolymers of N-hydroxyphenylmaleimides.

The novolak resins are preferred. They are made following procedures known in the art and disclosed in numerous publications such as by DeForest, *Photoresist Materials and Processes*, McGraw-Hill Book Company, New York, Ch. 2, 1975 and by Moreau, *Semiconductor Lithography Principles, Practices and Materials*, Plenum Press, New York, Chs. 2 and 4, 1988, both incorporated herein by reference. Novolak resins are the thermoplastic condensation product of a phenol and an aldehyde. Examples of suitable phenols for condensation with an aldehyde, especially formaldehyde, for the formation of novolak resins, include-phenol; m-cresol; o-cresol; p-cresol; 2,4-xylenol; 2,5-xylenol; 3,4-xylenol; 3,5-xylenol; thymol and mixtures thereof. An acid catalyzed condensation reaction results in the formation of a suitable novolak resin which may vary in molecular weight from about 500 to 100,000 daltons. The preferred novolak resins are the cresol formaldehyde condensation products.

Poly(vinyl phenol) resins may be formed by block polymerization, emulsion polymerization or solution polymerization of corresponding monomers in the presence of a suitable catalyst. Suitable materials, for purposes of the invention, include those materials disclosed in EPO application publication No. 0,255,989 and in U.S. Pat. No. 4,439,516 incorporated herein by reference.

An additional, though lesser preferred class of phenolic resins for purposes of the present invention, include homo and copolymers of N-hydroxyphenyl maleimides. Such materials are also disclosed in the above-cited European published application 0,255,989 beginning on page 2, line 45 and continuing to page 5, line 51, incorporated herein by reference for its teaching of such resins.

Included within the scope of the term "phenolic resin" as used herein are the copolymers of cyclic alcohols and phenols as disclosed in published European patent application No. 0 401 499 having a publication date of Dec. 12, 1990 and incorporated herein by reference.

Another component of the composition of the invention is one containing at least two active groups selected from epoxy groups, vinyl ether groups and mixtures of the two.

Useful epoxy-containing materials are disclosed in the above referenced EPO application publication No. 0,255,989. They may vary from low molecular weight monomeric materials to high molecular weight polymers and may vary greatly in the nature of their backbone and substituent groups. The backbone may be of any type and substituent groups may be any group free of an active hydrogen atom reactive with an oxirane ring at room temperature. Illustrative of suitable substituents include halogens, ester groups, ethers, sulfonate groups, siloxane groups, nitro groups, phosphate groups, etc. Exemplary epoxy-containing materials include glycidyl ethers such as the glycidyl ethers of polyhydric phenols obtained by reacting a polyhydric phenol with an excess of chlorohydrin such as epichlorohydrin. Further examples of epoxy materials of this type are described in U.S. Pat. No. 3,018,262, incorporated herein by reference.

There are many commercially available epoxy materials suitable for use in the compositions of the invention. Such materials include epichlorohydrin, glycidol, glycidylmethacrylate, the glycidyl ether of p-tertiarybutylphenol (e.g. those available under the trade designation "Epi-Rez" 5014 from Celanese); diglycidyl ether of Bisphenol A (e.g. those available under the trade designations "Epon 828," "Epon 1004" and "Epon 1010" from Shell Chemical Co. and "DER-331," "DER-332" and "DER-334, " from Dow Chemical Co.), vinylcyclohexene dioxide (e.g. "ERL-4206" from Union Carbide Corp.), 3,4-epoxy-6-methylcyclohexylmethyl-3,4-epoxy-6-methylcyclohexene carboxtlate (e.g. "ERL-4201" from Union Carbide Corp.), bis(2,3-epoxycyclopentyl) ether (e.g. "ERL-0400" from Union Carbide Corp.), aliphatic epoxy modified with polypropylene glycol (e.g. "ERL-4050" and "ERL-4052" from Union Carbide Corp.), epoxidized polybutadiene (e.g. "Oxiron 2001" from FMC Corp.), flame retardant epoxy resins (e.g. "DER-580," a brominated bisphenol type epoxy resin available from Dow Chemical Co.), 1,4-butanediol diglycidyl ether of phenol formaldehyde novolak (e.g. "DEN-431" and "DEN-438" from Dow Chemical Co.), and resorcinol diglycidyl ether (e.g. "Kopoxite" from Koppers Company, Inc.).

Examples of compounds with at least two vinyl ether groups include divinyl ethers of aliphatic, cycloaliphatic, aromatic or araliphatic diols. Examples of such materials include divinyl ethers of aliphatic diols having from 1 to 12 carbon atoms, polyethylene glycols, propylene glycols, polybutylene glycols, dimethylcyclohexanes, etc. Specific examples include divinyl ethers of ethylene glycol, trimethylene-1,3-diol, diethylene glycol, triethylene glycol, dipropylene glycol, tripropylene glycol, resorcinol, Bisphenol A, etc.

The photoactive compound used in the composition of the invention is one that liberates a photogenerated curing catalyst upon exposure to activating radiation. Preferably, the catalyst is an acid. The photogenerated curing catalyst initiates the reactions that cause cure of the binder components in the presence of curing agents, as necessary. Since the curing reactions are dependent upon a photogenerated catalyst, curing takes place only in exposed areas of a coating formed from the composition. Since all primary components of the binder are cured in the exposed coating, differential solubility between exposed areas and unexposed areas is excellent resulting in developed images of high resolution without significant loss of binder from exposed areas.

As stated above, preferred photoactive components of the invention are photoacid generators. Photoacid generators useful in the compositions of the invention are known in the art and extensively described in the literature such as in U.S. Pat. Nos. 4,090,936 and 5,034,304 incorporated herein by reference.

One class of preferred acid generators are onium salts of a Group VA element, onium salts of a Group VI A element, and aromatic halonium salts. These complex salts, upon being exposed to activating radiation such as ultraviolet radiation or electron beam irradiation, generate acids capable of initiating the required reactions.

Preferred onium photoactive compounds are aromatic iodonium complex salts and aromatic sulfonium complex salts. These materials are fully disclosed in the above noted published EPO application No. 0,255,989.

Examples of aromatic iodonium complex salt photoactive compounds include diphenyliodonium tetrafluoroborate, diphenyliodonium hexafluorophosphate, phenyl-2-thienyliodonium hexafluorophosphate, diphenyliodonium hexafluoroantimonate, di(2,4-dichlorophenyl)iodonium hexafluorophosphate, di(4-methoxyphenyl)iodonium hexafluorophosphate and di(3-methoxycarbonylphenyl)iodonium hexafluorophosphate, di(4-acetamidophenyl)iodonium hexafluorophosphate. Examples of aromatic sulfonium compounds include triphenylsulfonium tetrafluoroborate, dimethylphenylsulfonium hexafluorophosphate, tritolysulfonium hexafluorophosphate, 4-butoxyphenyldiphenylsulfonium tetrafluoroborate, tris(4-phenoxyphenyl)sulfonium hexafluorophosphate, 4-acetoxy-phenyldiphenylsulfonium tetrafluoroborate, tris(4-thiomethoxyphenyl)sulfonium hexafluorophosphate, di(methoxynaphthyl)methylsulfonium tetrafluoroborate, dimethylnaphthylsulfonium hexafluorophosphate and phenylmethylbenxylsulfonium hexafluorophosphate.

Of the aromatic sulfonium complex salts which are suitable for use in the compositions of the invention, triaryl substituted salts such as triphenylsulfonium hexafluorophosphate are preferred.

Another class of photoactive compounds suitable for purposes of the present invention are the photoacid generators such as those disclosed in U.S. Pat. No. 5,034,304. In particular, halogenated photoacid generators are preferred. These materials include 1,10-dibromodecane; 1,1-bis[p-chlorophenyl]-2,2-di-dichloroethane; 4,4¹-dichloro-2-(trichloromethyl) benzhydrol or 1,1-bis(chlorophenyl)2-2,2-trichloroethane (Kelthane ®); hexachlorodimethyl sulfone; 2-chloro-6-(trichloromethyl) pyridine; 0,0-diethyl-0-(3,5,6-trichloro-2-pyridyl)phosporothionate (Dursban ®); 1,2,3,4,5,6-hexachlorocyclohexane; N(1,1-bis[p-chlorophenyl]-2,2,2-trichoroethyl acetamide; tris[2,3-dibromopropyl]isocyanurate; 2,2-bis[p-chlorophenyl]1,1-dichloroethylene; and their isomers, analogs, homologs, and residual compounds. Most preferred of the aforesaid is tris[2,3-dibromopropyl]isocyanurate.

An additional component of the composition of this invention is a low temperature curing agent for the phenolic component of the binder catalyzed by photogenerated catalyst. Preferred curing agents are acid catalyzed materials reactive with the phenolic hydroxyl group. An especially preferred agent is a melamine formaldehyde resin. Melamine formaldehyde resins are amino resins formed by condensation of formaldehyde with melamine. The resins are typically ethers such as trialkylol melamine and hexaalkylol melamine. The alkyl group may have from 1 to as many as 8 or more carbon atoms but is preferably methyl. Dependent upon the reaction conditions and the concentration of formaldehyde, the methyl ethers may react with each other to form more complex units.

Melamine resins are known in the art, commercially available from American Cyanamid Company of Wayne, N.J. under the trade name Cymel and described in American Cyanamid's product bulletin *High Solids Amino Crosslinking Agents*, published in 1984 as Bulletin No. 4-2111 5K7/84. In accordance with this invention, the preferred melamine formaldehyde resin has a degree of polymerization varying between 1.3 and 2.0 and most preferably, is a member of the Cymel 300 Resin series which are highly methylated melamine formaldehyde resins. The most preferred melamine formaldehyde resin for purposes of this invention is Cymel 301 which is a hexamethoxymethyl melamine with a low methylol content having alkoxy groups as the principle reactive groups and a degree of polymerization of 1.5.

The preferred catalyzed crosslinking agents are believed to react primarily with the phenolic resin. Consequently, it is believed that the following exposure and low temperature cure and prior to development, the photoimaged composition in exposed portions of the film comprise a network consisting primarily of epoxy condensation products and the reaction product of the phenolic resin and the melamine resin.

Other conventional additives may be included in the compositions of the invention such as dyes, fillers, wetting agents, fire retardants and the like. Sensitizers constitute a preferred additive and are added to increase the range of wavelength photosensitivity. Suitable sensitizers include phenothiazines inclusive of substituted phenothiazines, 2-ethyl-9,10-dimethoxy-anthracene, 9,10-dichloroanthracene, 9,10-phenylanthracene, 1-chloroanthracene, 2-methylanthracene, 9-methylanthracene, 2-t-butyl anthracene, anthracene, 1,2-benzanthracene, 1,2,3,4-dibenzanthracene, 1,2,5,6-dibenzanthracene, 1,2,7,8-dibenzanthracene, 9,10-dimethoxydimethylanthracene, and the like.

To formulate the composition of the invention, components are dissolved in a suitable solvent such as, for example, one or more glycol ethers such as ethylene glycol monomethyl ether, ethylene glycol monoethyl ether; esters such as a methyl cellosolve acetate, ethyl cellosolve acetate, propylene glycol monomethyl ether acetate, dipropylene glycol monomethyl ether acetate and other solvents such as dibasic esters, propylene carbonate and gamma-butaryl lactone.

The concentration of composition components may vary within wide limits dependent upon the use of the material. Concentration ranges for the principal ingredients of the formulation are set forth in the following table and expressed as dry solids in parts by weight.

|  | Broad Range | Preferred Range |
| --- | --- | --- |
| Phenolic Resin | 25–65 | 40–50 |
| Epoxy or Vinyl Compound | 15–50 | 25–35 |
| Crosslinking Agent | 5–35 | 1–20 |
| Photoactive Compound | 1–15 | 2–10 |

In addition to the above components, other additives commonly found in such compositions, such as those described above, are present in minor concentration except for fillers and pigments which may be present in larger concentration such as, for example, in amounts of from 5 to 30 percent by weight of the total of the dry components.

The above components are desirably dispersed in a solvent to form a liquid coating composition. Their concentration in a solvent would depend on several factors, for example, the coating method used to apply the material to a substrate. For example, the concentration of the dry components in a slot coating composition would be higher than in a curtain coating composition. In general, the concentration of the dry components in the solvent may vary from about 10 to 50 weight percent or more of the total weight of the coating composition. For example, for a curtain coating composition, the percentage may vary between about 20 and 30 percent of the total concentration, and for slot coating may vary between 40 and 50 percent, it being understood that the weight percentage of solids in the composition would be best determined by the viscosity required for the particular coating method used. If the composition is to be applied as a dry film, of course the dry film would be essentially free of solvent.

The coating composition of the invention is used in conventional manner provided there is a step of low temperature cure following exposure and preceding development. Using a method for forming a printed circuit board for purposes of exemplification, the photoimageable composition may be applied to a substrate having a pattern of conductive material disposed thereon. The substrate may be a copper laminate substrate prepared by the method described in the second chapter of *Printed Circuits Handbook* by Clyde F. Coombs, Jr., 2nd Edition, McGraw-Hill, 1979. Other suitable substrates include those prepared by laminating multilayer boards for the manufacture of printed circuit boards with vias (through-holes) and interconnections which may contain solder, as described in chapter twenty-three of the above reference, both incorporated herein by reference.

The composition of the invention is coated onto the substrate using conventional techniques and preferably, the coating is deposited so as to yield a dry film thickness of at least 0.50 mil on top of a trace as required by IPC Specification No. SM-840B. After coating, the wet film formed is dried at a temperature varying between about 80° and 100° C. for a time of from about 20 to 60 minutes to remove solvent. During this drying step, it is desirable to avoid temperatures in excess of 120° C. and drying times of more than 60 minutes to prevent premature curing of the composition as this could make development difficult.

The process of transferring an image to the coating involves exposing the coating to a source of patterned activating radiation to initiate the photoreaction in exposed areas. Suitable sources of activating radiation include actinic radiation, x-rays, etc. Following exposure, the layer is subjected to a low temperature bake to initiate crosslinking of the exposed portions of the binder by the liberation of the photogenerated catalyst. The bake conditions comprise heating to a temperature capable of initiating the curing reaction but the temperature should be below that temperature where thermal crosslinking would occur in unexposed areas of the film. Preferably, the bake temperature varies between about 85° to 120° C. and the bake time ranges between 1 and 20 minutes. During this step, catalyst generated by the photoreaction initiates the curing reaction of the binder components in exposed areas of the film.

Following the above procedure, the area not exposed to activating radiation and free of photogenerated catalyst remains uncured and is readily dissolved by aqueous alkali solutions such as sodium hydroxide, sodium metasilicate, sodium carbonate, potassium hydroxide, potassium carbonate, ethylene diamine and the like. The preferred developer is a metal hydroxide with concentrations between 0.5 to 5% of alkaline hydroxide in water. A typical development time is 30 to 60 seconds. After development of the image, the remainder of the coating is characterized by a partial cure whereby most of the binder components are crosslinked. A second cure is desirable to achieve full thermal and electrical solder mask properties. This may be achieved by heating to a temperature of about 120° to 160° C. for a period of time of between about 10 and 60 minutes. The second cure hardens the developed image and the coating is resistant to soldering and may also be used as a permanent dielectric coating.

The above process is depicted in the drawing, Sequence A, where in step 1, substrate 1 is coated with soldermask coating 2. Exposure of soldermask coating 2 in step 2, using a photoacid generator for purposes of illustration, results in a region 3 of the coating having photogenerated acid in exposed areas as represented by the symbol H+. Thereafter, as shown by step 3A, following low temperature cure, coating 2 is cured in region 3 to crosslink the exposed areas of the coating. Following cure, the coating is developed to remove unexposed areas of the coating with exposed and cured region 3 remaining due to decreased solubility in the developer following cure. This is illustrated by Step 4A of the drawing. Finally, following full cure, as shown in step 5A, the crosslinking density in region 3 is significantly increased. By comparison, with reference to Sequence 2, if an attempt is made to cure all components of the binder of coating 2 in the absence of a catalyzed crosslinking agent, the result would be a coating 3 where all portions of the coating would be insoluble in developer as shown in steps 3B and 4B where in step 3A, high temperature cure is used and in step 4B, development is unsuccessfully attempted.

The following examples illustrate the invention.

EXAMPLE 1 to 9

The following compositions were prepared by customary mixing procedures where the phenolic resin used is poly-(p-vinylphenol) (PVP); the epoxy resin is a bisphenol A epoxy; the melamine is hexamethoxymethyl melamine; the photoinitiator (PI) is triphenylsulphonium tetrafluoroantimonate; and the solvents are 100% propylene glycol monomethyl ether acetate (S) or a cosolvent of 50% propylene glycol monomethyl ether acetate and 50% dipropylene glycol monomethyl ether acetate (Co). The concentration of each component for each example is as set forth in the following table.

| Example No. | 1 | 2 | 3 | 4 | 5 | 6 | 7 | 8 | 9 |
|---|---|---|---|---|---|---|---|---|---|
| Component |   |   |   |   |   |   |   |   |   |
| PVP | 45 | 40 | 50 | 50 | 40 | 45 | 50 | 50 | 40 |
| Epoxy | 55 | 60 | 50 | 50 | 45 | 40 | 35 | 35 | 45 |
| Melamine | 0 | 0 | 0 | 0 | 15 | 15 | 15 | 15 | 15 |
| P I | 4 | 8 | 8 | 6 | 6 | 8 | 4 | 8 | 4 |
| Solvent | S | Co | S | Co | Co | Co | Co | S | S |

Components were mixed together as specified and additional optional components (i.e. dyes, sensitizer, wetting agent and filler) were added. The solvent was added to the solids in a one-to-one weight ratio. Precleaned copper clad laminate panels 12"×12") were coated with each formulation using a draw down technique with a #65 Meier rod and dried for 30 to 40 minutes at 95° C. The boards were then exposed using the standard IPC-B25 primary image artwork. After exposure, panels were subjected to a first cure by heating for about 15 minutes at 95° C. Panels were then developed using an aqueous solution of 15 percent sodium hydroxide. After development, panels were subjected to a second cure by heating at 140° C. for 60 minutes.

The boards coated with the above compositions were then tested for survival in an alkaline copper plating bath (pH>13) for periods of 7 hours on two consecutive days for a total of 14 hours exposure to the bath. The boards were evaluated based on three criteria: adhesion, halo or encroachment, and spots. The best indication of how well the board survived is by the number of squares which survived 14 hours in the alkaline copper plating bath without lifting from the copper substrate. Adhesion was measured by counting the squares below the pads on the IPC-B25 pattern. The best results are indicated by the highest number of squares remaining on the board after the test.

Halo or encroachment was measured at specific locations, indicated by four areas of the IPC pattern, around the edges of a developed image. Halo's are indicative of non-adhesion in those areas and result in unsatisfactory electrical performance of the board. Each of the areas was measured for diameter of the halo and averaged. Because of the spacing between these four areas, a 15 mm encroachment was the worst score.

The boards were also visually examined for spots in the unimaged area of the panel. A 1"×1" template was placed on the film in 5 random locations, and the number of spots were averaged. Spots indicate lack of chemical resistance of the coating. Results are shown in the following table where adhesion is in pounds per linear inch:

TABLE 1

| Example No. | Adhesion | Halo | Spots |
|---|---|---|---|
| 1 | 7 | 15.0 | 0.8 |
| 2 | 0 | 15.0 | 0.3 |
| 3 | 2 | 11.0 | 0.3 |
| 4 | 2 | 13.8 | 1.8 |
| 5 | 21 | 1.5 | 2.0 |
| 6 | 21 | 3.3 | 1.0 |
| 7 | 21 | 1.8 | 4.5 |
| 8 | 21 | 1.9 | 3.8 |
| 9 | 21 | 4.3 | 3.0 |

Results show that the presence of melamine resin in Examples 5 to 9 significantly contributes to the number of squares that survive the 14 hour alkaline copper plating bath, and significantly reduces the size of the halo around developed areas. However, poly(vinylphenol) resins used in combination with melamine resins do not reduce the frequency of spots. Novolak resins appear to be more effective in reducing spot incidence.

EXAMPLES 10 to 18

In the following examples, the same materials were used except that a novolak resin formed by the condensation of formaldehyde with mixed cresols was substituted for the PVP.

| Example No. | 10 | 11 | 12 | 13 | 14 | 15 | 16 | 17 | 18 |
|---|---|---|---|---|---|---|---|---|---|
| Component | | | | | | | | | |
| Novolak | 50 | 40 | 40 | 45 | 50 | 50 | 45 | 40 | 40 |
| Epoxy | 50 | 60 | 60 | 55 | 35 | 35 | 40 | 45 | 45 |
| Melamine | 0 | 0 | 0 | 0 | 15 | 15 | 15 | 15 | 15 |
| P I | 4 | 8 | 4 | 8 | 4 | 8 | 6 | 8 | 8 |
| Solvent | Co | S | S | Co | S | Co | Co | Co | S |

Preparation, processing and evaluation were all in accordance with the procedures of Example 1. The results are shown in the following table.

TABLE 2

| Example No. | Adhesion | Halo | Spots |
|---|---|---|---|
| 10 | 21 | 15.0 | 0.8 |
| 11 | 2 | 15.0 | 0.3 |
| 12 | 1 | 15.0 | 0.5 |
| 13 | 10 | 15.0 | 0.0 |
| 14 | 21 | 2.0 | 0.0 |
| 15 | 21 | 1.5 | 0.0 |
| 16 | 21 | 1.0 | 0.0 |
| 17 | 21 | 1.5 | 0.0 |
| 18 | 21 | 1.1 | 0.0 |

Results show that the presence of melamine resin in formulations 14 to 18 improves adhesion, significantly reduces the diameter of any halo and reduces the number of spots on the board.

EXAMPLES 19

The following example comprises the most preferred embodiment of the invention.

| | Parts by Weight |
|---|---|
| Mixed Cresol Novolak Resin | 45.0 |
| Bisphenol A/Epichlorohydrin Epoxy Resin | 30.0 |
| Triarylsulfonium hexafluroantimonate | 4.0 |
| Hexamethoxymethylmelamine | 15.0 |
| Filler (talc) | 35.0 |
| Additives such as dyes and photosensitizer | 3.5 |
| Propylene glycol methyl ether acetate - Dipropylene glycol methyl ether acetate mixed solvent | 100.0 |

While particular embodiments of the invention have been described in the above Examples, it will be understood that the invention is not limited thereto since various modifications may be made.

We claim:

1. A method for forming an imaged film over a substrate, said method comprising the steps of:
   a. coating said substrate with a composition comprising a binder and a curing system for components of said binder, said binder comprising an admixture of a phenolic resin and a compound having at least two reactive functionalities selected from the group of an epoxy radical, a vinyl ether radical and a mixture of an epoxy and a vinyl ether radical, and said curing system comprising a crosslinking agent for the phenolic resin and a photoactive compound capable of generating a curing catalyst for said binder, said phenolic resin being present in an amount sufficient to render unexposed portions of the composition alkali soluble, said compound having at least two reactive functionalities being present in an amount capable of hardening said composition and said curing system being present in an amount capable of curing the components of the binder upon exposure to activating ratdiation and baking before development;
   b. exposing at least a portion of said coating to activating radiation to generate said curing catalyst in exposed portions of said coating;
   c. curing said exposed portions of said coating by baking the same; and
   d. developing said coating by contact with an aqueous based developer.

2. The method of claim 1 where the phenolic resin is selected from the group consisting of a novolak resin and a polyvinyl phenol, the compound having the reactive functionality is an epoxy resin, and the curing system is an onium salt and an acid activated crosslinking agent for the phenolic resin, each being present in a concentration in parts by weight as follows:

| phenolic resin | 25–65 |
|---|---|
| epoxy resin | 15–50 |
| crosslinking agent | 5–35 |
| onium salt | 1–15. |

3. The method of claim 2 where said components are present in the following amounts in parts by weight:

| phenolic resin | 40–50 |
|---|---|
| epoxy resin | 25–35 |
| crosslinking agent | 1–20 |
| onium salt | 2–10. |

4. The method of claim 2 where said crosslinking agent is a melamine resin.

5. The method of claim 4 where the melamine resin is hexamethoxymethylmelamine.

6. The method of claim 2 where said onium salt is a sulfonium compound.

7. The method of claim 2 where the composition is applied as a liquid coating composition and the concentration of solids in solution varies between about 10 and 50 percent by weight of the total composition.

8. The method of claim 2 where the composition is applied as a dry film.

9. The method of claim 2 where the step of curing prior to development is by heating to a temperature of between about 85° and 120° C.

10. The method of claim 2 including a post development thermal cure by heating the developed coating to a temperature of between about 120° and 160° C.

* * * * *